(12) United States Patent
Budge

(10) Patent No.: US 6,678,642 B1
(45) Date of Patent: Jan. 13, 2004

(54) METHOD OF AND APPARATUS FOR MODELING INTERACTIONS

(75) Inventor: Kent G. Budge, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 09/169,300

(22) Filed: Oct. 8, 1998

(51) Int. Cl.[7] .................. G06F 17/10; G06F 17/50; G06F 7/48

(52) U.S. Cl. .................. 703/2; 703/1; 703/7

(58) Field of Search .................. 703/1–2, 7

(56) References Cited

U.S. PATENT DOCUMENTS 5,569,860 A * 10/1996 Aizawa et al. .................. 73/863
5,572,434 A * 11/1996 Wang et al. .................. 700/197

OTHER PUBLICATIONS

Venkatasubban: "A new finite element formulation for ale (arbitrary lagrangian eulerian) compressible fluid mechanics"; Int. J. Engin. Science; pp. 1743–1762, Oct. 1995.*

Hirt et al.; "An arbitrary Largrangian–Eulerian computing method for all flow speeds"; J. Computational Physics; pp. 203–216, Aug. 1997.*

Lai et al.; "Coupling meshes in 3D problems involving movements"; IEEE Trans. Mag.; pp. 1732–1734, Mar. 1992.*

Golovanov et al.; "3D mesh connection techniques applied to movement simulation"; pp. 3359–3362, Nov. 1997.*

Kang et al.; "Investigation into the thermo–viscoplastic finite element analysis of square die extrusin of square section with largangian description"; Int. J. Machine Tools & Manu.; pp. 907–924, Aug. 1996.*

Humphries et al.; "Numerical models of pressure pulse generation by imploding metal liners"; IEEE Trans. Plasma Physics; pp. 1334–1347, Dec. 1996.*

Blacker, CUBIT Mesh Generation Environment: vol. 1 Users Manual, Sandia National Laboratories SAND94–1100.

Blacker, FASTQ Users Manual, Version 2.1, Sandia National Laboratories SAND88–1326.

Summers, et al., ALEGRA: An Advanced Framework for High Energy Density Solid Dynamics Simulations, Sandia National Laboratories SAND97–2636C.

Benson., "An Efficient Accurate, Simple ALE Method for Nonlinear Finite Element Programs," in Computer Methods in Applied Mechanics and Engineering 72 (1989).

(List continued on next page.)

Primary Examiner—Hugh Jones
(74) Attorney, Agent, or Firm—Y. Gerald Grafe; Kevin W. Bieq

(57) ABSTRACT

A method and apparatus for modeling interactions can accurately model tribological and other properties and accommodate topological disruptions. Two portions of a problem space are represented, a first with a Lagrangian mesh and a second with an ALE mesh. The ALE and Lagrangian meshes are constructed so that each node on the surface of the Lagrangian mesh is in a known correspondence with adjacent nodes in the ALE mesh. The interaction can be predicted for a time interval. Material flow within the ALE mesh can accurately model complex interactions such as bifurcation. After prediction, nodes in the ALE mesh in correspondence with nodes on the surface of the Lagrangian mesh can be mapped so that they are once again adjacent to their corresponding Lagrangian mesh nodes. The ALE mesh can then be smoothed to reduce mesh distortion that might reduce the accuracy or efficiency of subsequent prediction steps. The process, from prediction through mapping and smoothing, can be repeated until a terminal condition is reached.

24 Claims, 6 Drawing Sheets

OTHER PUBLICATIONS

Benson., "Vectorization Techniques for Explicity Arbitrary Lagrangian–Eulerian Calculations," in Computer Methods in Applied Mechanics and Engineering.

Peery et al., "RHALE: A 3–D MMALE Code for Unstructured Grids," *Proc. 1993 Winter ASME Mtg.*, New Orleans, La.

McGlaun et al., "The Development and Application of Massively Parallel Solid Dynamics Codes," *SAND95–0095C*.

Summers et al., "Recent Progress in ALEGRA Development and Application to Ballistic Impacts," *Int. J. Impact Engng.* 20, 779 (1997).

Peery et al., "Multi–Material ALE methods in unstructured grids," *Comput. Methods Appl. Mech. Engrg. 187*, 591 (2000).

* cited by examiner

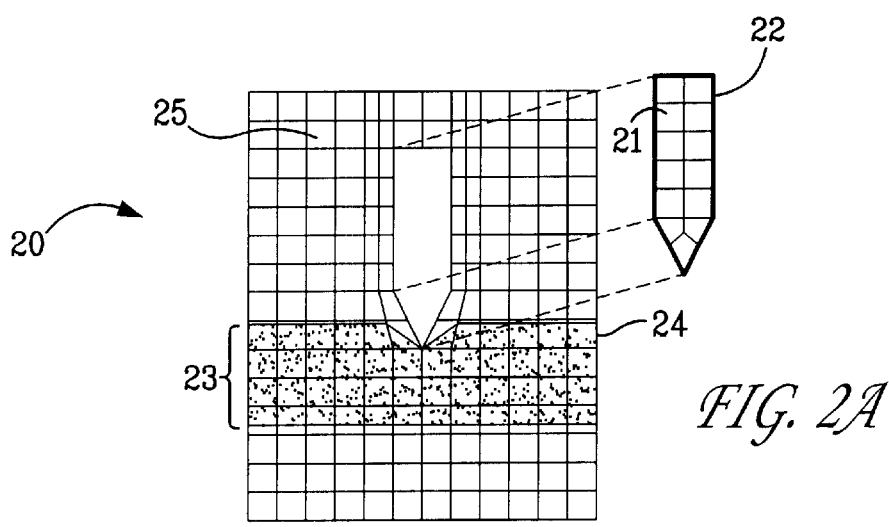
FIG. 2A
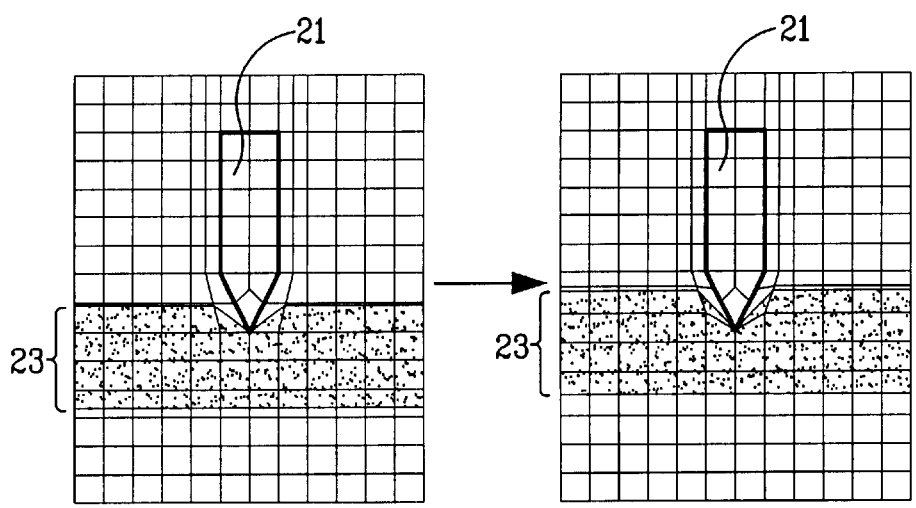
FIG. 2B
FIG. 2C
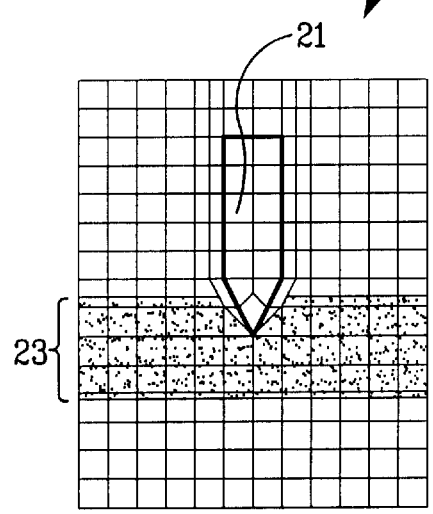
FIG. 2D

Time: 0.00000

Time: 0.00025

METHOD OF AND APPARATUS FOR MODELING INTERACTIONS

This invention was made with Government support under Contract DE-AC04-94AL85000 awarded by the U. S. Department of Energy. The Government has certain rights in the invention.

BACKGROUND OF THE INVENTION

This invention relates to the field of modeling interactions, specifically modeling interactions where part of a problem space remains topologically consistent while another part can undergo topological disruption. This invention relates more specifically to the field of using a computer to model interactions between a hard material and a soft material.

Soft/hard interactions are a set of engineering problems in which a rigid body interacts with a softer material. A hard metal die D forming a softer metal or plastic P, as illustrated in FIG. 1, is an example of this sort of interaction. Soft/hard interactions can be difficult to model because of the very different behaviors of the two materials. In particular, detailed modeling of tribological effects and internal functions in the hard material can best be done in a Lagrangian framework, while accurate modeling of the bifurcating soft material can best be done in an Eulerian framework.

The difficulty of modeling a bifurcating flow field using a Lagrangian mesh arises from the topological aspects of the bifurcation. A continuous flow field, free of bifurcations, changes the shape of a body without changing the connectivity of the body. Surface points remain on the surface, interior points remain in the interior, and neighboring points remain neighbors. This allows an analytic function to map the final configuration of the material back to the original configuration. Such functions are easily represented on a discrete mesh.

A bifurcation, however, produces a discontinuity on the flow field. Neighboring points on either side of the bifurcation are no longer neighbors, and new surface points are created that do not map to any surface in the original configuration. A static Lagrangian mesh, in which the connectivity does not change, thus can not model the bifurcating behavior. Either the mesh must be Eulerian, for which mapping between initial and final configurations is not required, or a method must be employed to reconnect the Lagrangian mesh and correctly capture the topology of the bifurcation.

It is theoretically possible to model soft/hard interactions with Eulerian meshes, but the results can be disappointing. A large number of cells are required to represent thin structures and small components, and sophisticated interface trackers can be required to preserve material interfaces. Velocity discontinuities at the soft/hard interface are not well represented. Resulting models can be expensive, and can lack accuracy and robustness.

Several methods have been proposed for modeling soft/hard interactions, including a posterior methods, heterogeneous mesh methods, free Lagrange methods, and smooth particle hydrodynamics methods.

a posterior methods assume that the line of bifurcation is known in advance. A "pilot hole" is positioned along the line of bifurcation and conventional contact surfaces defined between the rigid body and the sides of the pilot hole. Because a posterior methods require advance knowledge of the line of bifurcation, they cannot be readily used to model complex or unknown trajectories. Further, the mechanical work required to create the bifurcation is not correctly modeled. Also, localized strain around the bifurcation can make generation of suitable meshes very difficult.

In a heterogeneous mesh method an Eulerian mesh is used to represent the soft material and a Lagrangian mesh is used to represent the hard material. A transition mesh (usually referred to as an ALE or arbitrary Lagrangian-Eulerian mesh) is used to join the two regions. Bifurcation usually occurs along the boundary between the hard Lagrangian material and the soft Eulerian material, however, leaving no place for the transition region if the Eulerian and Lagrangian boundaries are to coincide.

Free Lagrange methods dynamically change the connectivity of a Lagrangian mesh to represent bifurcation. A successful free Lagrange method must detect bifurcating points, determine the direction of propagation of a bifurcation, and change the mesh connectivity. Detection of bifurcating points can be difficult, and determining the direction of bifurcation can be even more difficult. Without accurate, robust techniques for detection of bifurcations and determination of bifurcation direction free Lagrangian methods are limited in application.

A smooth particle hydrodynamics method eliminates the concept of a mesh representation for the soft material. The hard material is represented in a Lagrangian mesh, but the soft material is represented by a set of particles that interact through a smooth potential with their neighbors. The interaction between hard and soft materials can be modeled with a straightforward contact method. Unfortunately, there is shot noise from the statistical nature of the smooth particle interactions, and there is a strong tendency for the soft material to behave as a viscous liquid rather than a soft solid.

Accordingly, there is a need for method and apparatus for modeling interactions that can accurately model tribological and other properties and can accommodate topological disruptions.

SUMMARY OF THE INVENTION

The present invention provides a method and apparatus for modeling interactions that accurately models tribological and other properties and accommodates topological disruptions sound.

In a method according to the present invention, a first portion of a problem space is represented with a Lagrangian mesh. The first portion can, for example, correspond to a hard material. A second portion of the problem space is represented with an arbitrary Lagrangian-Eulerian (ALE) mesh. An ALE mesh can adaptively behave as a Lagrangian mesh, an Eulerian mesh, or anything in between. In the present invention, the ALE mesh behaves much like an Eulerian mesh but adapts to maintain correspondence between the Lagrangian and ALE contact surfaces. The second portion can, for example, correspond to a soft material. The first and second portions are substantially non-overlapping, and together can cover the entire problem space. The ALE and Lagrangian meshes are constructed so that each node on the surface of the Lagrangian mesh is in a known correspondence with adjacent nodes in the ALE mesh. The interaction is predicted for a time interval, for example by a finite element mechanical simulation of a hydrodynamics simulation. The prediction provides predicted locations for the nodes in the two meshes. The prediction step can enforce contact constraints, including enforcing contacts that might otherwise cause the meshes to overlap. The nodes in the ALE mesh in correspondence with nodes on the surface of the Lagrangian mesh are then mapped so that they are once again adjacent to their corresponding Lagrangian mesh nodes. The ALE mesh can then be smoothed to reduce mesh distortion that might reduce the accuracy or efficiency of subsequent prediction steps. The process, from prediction through mapping and smoothing, can be repeated until a terminal condition is reached.

The present invention also comprises a method for using a computer to model interactions. Representations using ALE and Lagrangian meshes, as discussed above, are loaded into or generated on the computer. The prediction step can be accomplished with simulation codes known to those skilled in the art. The computer can then be directed to map and smooth the ALE nodes as discussed above.

The present invention also comprises an apparatus for modeling interactions. A processor connects with an input/output system and storage. The apparatus further comprises means for representing, in storage, representations of portions of the problem space in ALE and Lagrangian meshes, means for predicting the locations of the mesh nodes after a time interval, means for mapping the nodes after prediction, and means for smoothing the ALE mesh, which can comprise computer software, hardware, or network downloads.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

FIGS. 2 (a,b,c,d) are illustrations of a problem representation according to the present invention.

DETAILED DESCRIPTION OF THE INVENTION

Figure 1:
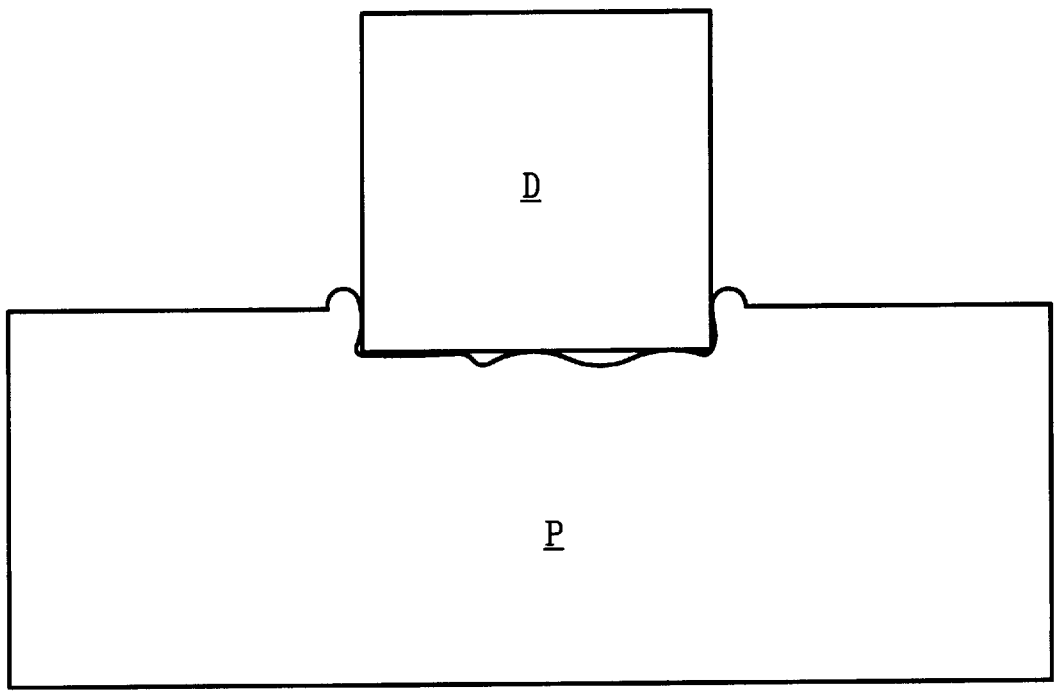
FIG. 1 is an illustration of a class of interaction suitable for modeling with the present invention.

The present invention provides a method and apparatus for modeling interactions occurring in a problem space. Interactions such as those between a first and second body, wherein the first body remains topologically unchanged (neighboring nodes remain neighbors) and the second body can change topologically (e.g., tear or divide), can be effectively modeled with the present invention.

The present invention treats the problem space as at least two portions: a first portion represented by a Lagrangian mesh and a second portion represented by an ALE mesh. FIG. 2a shows an example of this, where a first portion 22 of problem space 20, corresponding to a relatively hard body 21, is represented in a Lagrangian mesh 22. A second portion 24 of problem space 20, corresponding to a soft body 23 and the surrounding environment 25, is represented in an ALE mesh 24. The use of a Lagrangian mesh allows accurate modeling of friction and material characteristics such as strength. The use of an ALE mesh allows material transport across mesh node boundaries, important to accurate and efficient modeling of complex interactions such as material bifurcation and tearing. The benefits of the combination of an ALE mesh and a Lagrangian mesh can be attained through use of the present invention as described in detail below.

Method of Modeling Interactions

Figure 3:
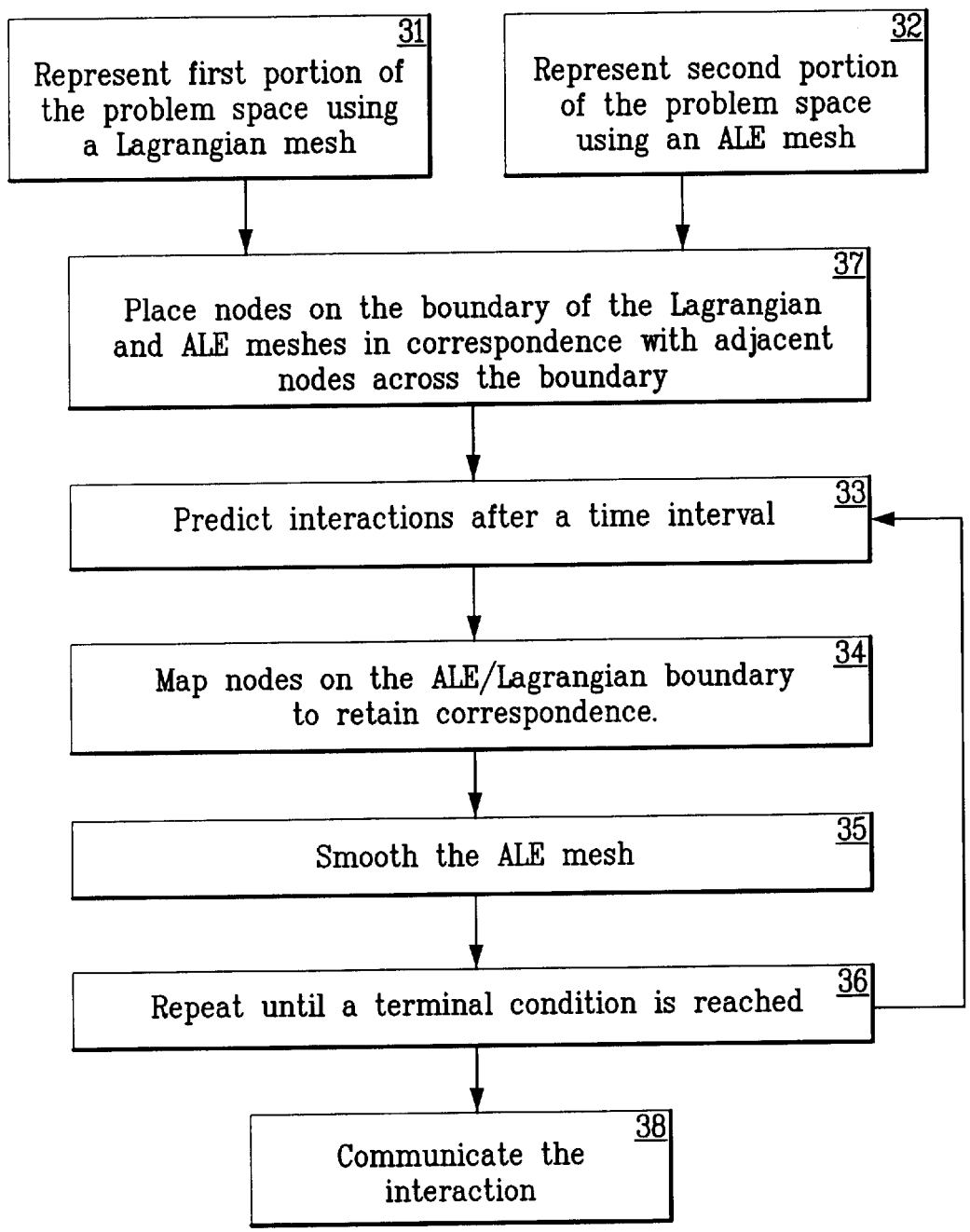
FIG. 3 is a flow diagram of a method according to the present invention.

FIG. 3 is a flow diagram of a method according to the present invention. The basic steps are discussed first, followed by detailed descriptions of each step.

A first portion of a problem space is represented using a Lagrangian mesh 31. For example, the first portion can correspond to a relatively hard body in the problem space. A second portion of the problem space is represented using an ALE mesh 32. For example, the second portion can correspond to a relatively soft body in the problem space. For example, the first portion can correspond to a hardened die and the second portion to a workpiece to be formed using the die. The nodes on the boundary between the Lagrangian and ALE meshes are placed in a defined correspondence with adjacent nodes across the boundary 37. For example, nodes can be placed in one to one correspondence as shown in FIG. 2b.

The interaction is then modeled, or predicted, for a time interval 33. Those skilled in the art will appreciate various suitable prediction methods. The prediction method employed can require additional information. For example, a finite element mechanical prediction method can be used, and can require information specifying material properties and external loading. As another example, a hydrodynamics prediction method can be used, and can require information specifying material properties and initial conditions. Prediction step 33 can also comprise contact constraint enforcement. For example, prediction without contact constraint enforcement can use stress states, external forces, and boundary forces to predict material motion that violates contact constraints. Contact constraint enforcement can impose additional forces to ensure that constraints are not violated (for example, adding forces so that two materials do not flow into each other, or so that one end of a structure remains stationary). As those skilled in the art appreciate, the time interval can depend on the prediction method used. The prediction method provides predicted final positions for the mesh nodes after the time interval. An example of this is shown in FIG. 2c, where relatively hard body 21 has moved relative to relatively soft body 23.

At the end of prediction step 33, the nodes in the Lagrangian and ALE meshes have predicted locations. The Lagrangian mesh is not remeshed: its nodes remain at their predicted locations. No material flows between Lagrangian nodes, so the topology of the Lagrangian mesh remains the same as the topology of the material represented in the Lagrangian mesh. The ALE mesh, however, can be remeshed or mapped 34. ALE nodes not on an ALE/Lagrangian boundary can be mapped to their previous locations (or to new locations tracking the motion of the Lagrangian mesh, for example to new locations so that the centers of mass of the Lagrangian and ALE meshes remain in substantially the same relative relationship). ALE nodes that are on an ALE/Lagrangian boundary can be mapped so that the ALE/Lagrangian boundary is preserved. FIG. 2d shows the results of mapping the mesh nodes of FIG. 2c so that the boundary nodes are once again in one to one correspondence.

Remeshing or mapping of the ALE mesh does not represent physical motion of the materials being modeled.

Rather, it merely changes the boundaries that are used to divide up the material for modeling its behavior. Changing node boundaries can require that material and energy be reassigned between nodes to correspond to the new boundaries. Because the ALE nodes are not tied to specific material, the topology of the material does not have to remain the same as the topology of the ALE mesh. For example, material fracturing in a node can flow out of the node, leaving an empty node corresponding to the site of the fracture. As another example, a material vortex can twist a Lagrangian mesh; remapping the ALE mesh allows the material to twist without twisting the ALE mesh.

Mapping the ALE mesh nodes can distort the ALE mesh, especially if the interaction produces significant translation or rotation of the Lagrangian mesh relative to the ALE mesh. The distortion can become sufficiently large that the accuracy or efficiency of the prediction step is compromised. Consequently, the ALE mesh can be smoothed 35 to adjust the ALE node boundaries to reduce the distortion. Nodes that exceed some distortion criteria can be selected for smoothing (e.g., nodes whose volume differs from neighboring nodes' volumes by some amount, or nodes having solid angles outside some range). Those nodes can be smoothed by iteratively determining new node locations from previous node locations using equipotential or Budge serendipity smoothing templates, for example. Note that if the ALE mesh is not significantly distorted, smoothing can comprise leaving the ALE mesh unchanged after the mapping step.

After mapping 34 and smoothing 35, the ALE and Lagrangian meshes are ready for another time interval prediction 33. The process can be repeated 36 until a terminal condition is reached. For example, a selected number of time intervals can be modeled, or a specific ending condition such as a terminal position or temperature can be reached. The modeled interaction can be communicated, for example, by printing, storing, transmitting, or displaying selected aspects of the interaction.

MESH REPRESENTATION

Those skilled in the art will appreciate various techniques for representing a problem space by a mesh. The present invention is not limited to a specific meshing technique. The meshing technique must provide for dual meshes (Lagrangian and ALE) and must allow correspondence between boundary nodes of the Lagrangian and ALE meshes.

As an example, the meshing techniques described by Blacker in "CUBIT Mesh Generation Environment: Volume 1: Users' Manual," SAND94-1100, incorporated herein by reference, and by Blacker in "FASTQ Users Manual, Version 2.1," SAND88-1326, incorporated herein by reference, are suitable for use in the present invention. Consider meshing a problem space similar to that in FIG. 2a. The following steps can accomplish the desired dual meshes and node correspondence.

1. Define a number of points in the problem space by providing a label and coordinates for each point. Defined points can be corners of regions, for example. Details of an exemplary point-defining step are that described below are from the FASTQ Users' Manual in §3.1.2, at page 27.

Points are generally used to indicate actual locations within the geometry. Each point is identified by a point number and an x,y or R,θ coordinate pair of values. All lines employ points as either the line terminators, or line parameter specifiers. When used as parameter specifiers, the point may actually not refer to a geometric location but instead merely store some needed value as its x or y coordinate.

It must be understood that points and nodes are not the same entity. A node is associated with the generated finite element mesh coordinates, whereas a point deals only with the defining geometry. Because a node is always generated at the end points of a line when the mesh is generated, nodes and points may share the same coordinates. Also, boundary flags can be attached to the nodes generated at points through the point boundary flag.

2. Define a set of line segments or curves using the defined points. For example, a line segment can be defined by specifying the defined points to use as the line segment's endpoints. An arc can be defined by specifying its endpoints and a point for the center of curvature of the arc. For each line segment or curve, specify the number of segments into which it is to be divided in meshing, and specify a factor defining the length ratio of successive segments. Line segments and curves can correspond to boundaries a region as to be meshed. Details of an exemplary line-defining step that are described below are from the FASTQ Users' Manual in §3.1.3, at page 28.

Lines are used to define the boundary of geometric regions. Lines may be straight, portions of circular arcs, portions of logarithmic spirals, or portions of parabolic arcs. A line definition includes each of the following items:

Line Number Identifies the line.

Line Type The type of line to be generated. Available line types are as follows:
     STR A straight line.
     CIRC A circular arc (or logarithmic spiral) about a center point.
     CIRM A circular arc with the third point on the arc.
     CIRR A circular arc with the radius given.
     PARA The tip of a parabolic arc.
     CORN A corner formed by two line segments. The first segment is from the first point to the third point, and the second segment is from the third point to the second point.

First Point Indicates a beginning point number for the line.

Second Point Indicates as ending point number for the line.

Third Point A third point needed to complete the line definition of types other than straight lines. This point is discussed in detail below.

Intervals The number of intervals or subdivisions of this line for mesh generation. These intervals are evenly spaced along the line unless a factor other than 1.0 is specified.

Factor The ratio of succeeding interval lengths along the line starting from the first point and progressing toward the second point. For instance, if a factor of 2.0 is specified, each interval along the line will be 2 times longer than the preceding interval. The default is 1.0.

The meaning of the third point for the six different line types available is as follows:
     STR The third point has no meaning for a straight line definition.
     CIRC The third point is the center point for the circular arc or logarithmic spiral. If the third point number has been entered as a positive integer, as arc is defined counterclockwise about this point from the first point to the second point. If the third point number has been entered as a negative integer, the arc is reversed to a clockwise one from the first point to the second point about the third point. Note that switching first and second points has the same effect as changing sign on the third number. The actual arc is calculated as a logarithmic spiral that forms the degenerate case of a perfect circular arc if the distance from the first point to the third point and from the second point to the third point is equal. This representation allows for arcs in which the radius can change as a function of the angle traversed.

CIRM The third point, as the line type definition indicates, is another point on a circular arc connecting the two end points, A circular arc can always be drawn through three points unless the three points are colinear, In this case the line is generated as a straight line.

CIRR The third point is used to specify the radius of the arc to be generated. The first coordinate (x value) of the third point will be used as the radius of the arc to be generated. The second coordinate (y value) of the point is irrelevant. If the third point number is given as a positive integer, the center point is assumed to lie on the left of a straight line drawn from the beginning point to the ending point. If the third point number is a negative integer, the center is assumed to be on the right of such a line. In either case, the arc that is generated and the center of the arc are always on opposite sides of this line. Thus only arcs less than 180 degrees can be generated with this definition.

PARA The third point is the peak of the parabola with the beginning and ending points equal arc lengths away on either side of the third point. In other words, to generate a parabolic arc the three points must form an isosceles triangle. This definition limits the user to generation of the tip of parabolic shapes only.

CORN The third point must be the corner point of the line as explained in the definition above. The only advantage of this line over two straight lines is that the number of intervals for the two lines combined can be controlled with one interval setting.

3. Define regions as closed sequences of line segments and curves. Assign each region a label and a material index. The label is for later reference; the material index identifies the material properties in the region. Details of an exemplary region-defining step that are described below are from the FASTQ Users' Manual in §3.1.5, at page 31.

Regions are the basis for all quadrilateral mesh generation preformed by FASTQ. A region is simply a list of sequential lines and/or sides which enclose an area to be meshed. Dividing or decomposing an arbitrary geometry into regions appropriate for meshing is largely an art. Primitive regions, or regions can be nicely meshed by FASTQ. A specific meshing instruction or scheme is associated with each region as explained in the scheme definition below. A block ID number is also associated with each region. The block ID allows for the specific material properties and/or body forces to be associated with each region of the geometry. This region block ID can be shared by multiple regions, but it cannot match any barset block ID since the element types are different.

In the FASTQ file, all side numbers in the region list are given as a positive integer, while line numbers are specified as their respective line number negated. A region definition includes each of the following items:

Region Number Identifies the region.

Line Number The block ID to be given to all elements in the region.

Side/Line Number 1 The first side or line of the region.

Side/Line number n The n'th side or line of the region.

4. Define element sets and node sets (generally sets of line segments and curves) to which various boundary conditions will be applied. These can be used for symmetry conditions and boundary conditions in the prediction step. These can also be use to identify the boundary between the region to be represented by ALE mesh and the region to be represented by Lagrangian mesh. Details of an exemplary element node-defining step that are described below are from the FASTQ Users' Manual in §§3.1.9-11, at page 33.

Point Boundary Flags are used to attach boundary conditions to finite element nodes that are generated at point locations. Since all line end points will align with a generated mesh node, any line end point may be flagged. The flag can be used to reference the node for restraint of loading of some type in the analysis. Multiple flags can be attached to the same point number, and thus the same node, if desired. A Point Boundary Flag definition includes the following items:

Point Boundary Flag The integer flag number.

Point Number 1 The first point to be flagged with this flag.

Point Number n The n'th point to be flagged with this flag.

Line Boundary Flags are used to attach boundary conditions to finite element nodes that are generated along specific lines in the geometry. The flag can be used to reference nodes for restraint or loading in the analysis. Multiple flags can be attached to the same line number if desired. The definition may contain lines and geometric sides, although the geometr4ic sides are used as merely a convenient way of entering multiple lines. If a side is used in the definition it must be negated. A Line Boundary Flag definition includes the following items:

Line Boundary Flag The integer flag number.

Line/Side Number 1 The first line or side to be flagged with this flag.

Line/Side Number n The n'th line or side to be flagged with this flag.

Side Boundary Flags are used to attach boundary conditions to finite element sides which are generated along specific lines in the geometry. The flag can be used to reference element sides for attaching loadings or for attaching boundary conditions in the analysis. Multiple flags can be attached to the same line number if desired. It should be noted that the Side Boundary Flag is named to indicate flagging of element sides and not geometric sides. The definition may contain lines and geometric sides, although the geometric sides are used as merely a convenient way of entering multiple lines. If a side is used in the definition it must be negated. A Side Boundary Flag definition includes each of the following items:

Side Boundary Flag The integer flag number.

Line/Side Number 1 The first line or side to be flagged with this flag.

Line/Side Number n The n'th line or side to be flagged with this flag.

Remember, a Line Boundary Flag attaches flags to nodes, and a Side Boundary Flag attaches flags to element sides.

5. Specify a meshing scheme for each region, for example, rectangular or triangular. Details of an exemplary meshing scheme step that are described below are from the FASTQ Users' Manual in §4.3.2, at page 56.

The quadrilateral mesh generation algorithm in FASTQ is based on the mapping of a region into a unit square. The real power of FASTQ is in its ability to not only mesh the basic rectangular region with all quadrilateral elements, but also to mesh other primitive shapes algorithmically. In order to accomplish this task the basic algorithm has been extended to mesh the nonrectangular primitive shapes of circles, quartercircles, semicircles, triangles, and pentagons as well as to mesh transition regions from fine to coarse element sizes with little or no user interaction being required. Several mesh modification options are also available to correct some meshing problems encountered when working with more arbitrary shaped regions.

The quadrilateral mesh generated within a region is controlled by the scheme attached to each region. This scheme indicates, either explicitly or by default, an initial meshing primitive, subsequent adjustment of the initial mesh, and if step processing, control of the interactive meshing process. A scheme can either be associated with a particular region using the scheme card, can be defaulted for all nonspecified regions, or can be defaulted by no user specification. The default scheme in FASTQ when otherwise left unspecified by the user is M indicating a general rectangular primitive mesh.

The generation of eight or nine node elements is controlled by the element type flag. This flag can be set in the MESH or KEYIN option of FASTQ with the appropriate EIGHT or NINE option toggle. It can also be set with a card in the FASTQ file consisting of the word EIGHT or NINE indicating which type of element is desired. The default is generation of four node quadrilateral elements. Only one type of quadrilateral element may be generated for a body, but quadrilateral elements may be combined with bar elements in the same body.

When processing regions, FASTQ first checks all the data associated with the region for connectivity and validity. The results of this check are output to the user to enable correction of any existing problems with the data. FASTQ then generates an initial mesh for each region. The initial mesh is generated based on variations of the basic rectangular mapping algorithm depending on which meshing primitive scheme has been indicated, and the location of nodes around the perimeter of the region.

FASTQ generates the perimeter nodes of the region based on the line definitions and their interval and factor assignments. All initial meshing primitives require an even number of nodes around the perimeter. If an odd number has been specified, the program attempts to correct the error by increasing the number of intervals on the line in the boundary which has the largest interval spacing and has not yet been used for meshing of a previous region. Once a line has been used for meshing of a region, its intervals remain fixed to insure continuity across boundaries. Since FASTQ is only attempting to correct the error locally, a line interval change in one region may force cascading interval changes in other unprocessed regions which contain the same line.

Once the perimeter has been generated successfully, the program generates all interior nodes, elements, and connectivity using mapping algorithms based on the primitive indicated in the scheme for the region. FASTQ currently contains six meshing primitive scheme indicators. FASTQ searches the entire scheme for the primitive scheme characters and thus they need not be the first letter of the scheme. The generation of the mesh is always dependent on the existence of natural corners and sides. These natural sides are in no way tied to the geometric sides, in that the user need not explicitly define a side. In fact, in only one primitive, the forced rectangle primitive, is the geometric side definition of the user followed in initial mesh generation. The primitive schemes are as follows:

M General Rectangle Primitive (Start of a Circle Primitive)
T Triangle Primitive
B Transition Primitive
C Semicircle Primitive
U Pentagon Primitive
otherwise Forced Rectangle Primitive General Rectangle Primitive—M. An M in the scheme indicates that the region will be meshed as a rectangle, and that FASTQ will algorithmically choose four good corners for this rectangle from the perimeter nodes around the region. This choice is based on interior angles of the perimeter nodes and boundary interval assignments. For this scheme to produce a good initial mesh, the region must have 4 natural corners and the user must specify equal intervals on opposing natural sides of the region. No formal side definitions are followed in the choice of the best corners. Circular regions, regions with one natural side and no natural corners, can be meshed using the general rectangular primitive M with one or more necklaces with smoothing NS subsequently added.

It is possible that incorrect interval assignments will force mapping corners for the region to lie along fairly straight sides. This problem is usually apparent in a plot of the resulting mesh, but under certain situations the mapping produces completely flat elements along a straight side, and the plot may still appear normal. Thus, whenever a mapping corner has a large interior angle, the user is given a warning to indicate that there may be problems in the final mesh. This warning will always appear when processing circular regions as they contain no natural corners, and in this instance the warning can be ignored.

Triangle Primitive—T. A T in the scheme indicates that the region should be initially meshed as a triangle. The definition of a triangle is general in that regions containing 3 natural corners can often be meshed successfully with this algorithm. For instance, quarter circular shapes are handled nicely by this primitive. Again, the algorithmic choice of good corners is based on interior angles of perimeter nodes and boundary interval assignments. This algorithm requires that there be at least 6 intervals around the perimeter of the region. For this scheme to produce a good initial mesh the natural side with the most intervals must have at least 2 less intervals than the sum of the intervals on the remaining two sides. The triangle primitive algorithm divides the initial region into three rectangular subregions based on region shape and interval assignment. Each of these subregions are then meshed and combined into one region for subsequent processing. This always results in one of the interior nodes being connected to only three elements instead of the standard four elements. The location of this node can be adjusted with interval assignments. As all three natural side interval assignments become equal, the node becomes equally far from each boundary. An often beneficial next step is the application of the length weighted Laplacian smoother 6S or centroid area pull smoother 4S.

Transition Primitive—B. A B in the scheme indicates that the region will be meshed as a transition between differing numbers of elements on opposing sides of the region. This primitive has been designed for use with rectangular shaped regions, but has proven to be useful for other shapes as well. The algorithm requires that there be at least 8 intervals around the perimeter of the region. No relationship is imposed between intervals of lines on opposing sides of the transition region. The algorithm uses the perimeter nodes to choose four best corners, and designates a base side that contains the most unmatched intervals, that is the opposing natural side contains a different number of intervals than the base side. For this scheme to produce a good initial mesh, there must be at least 4 intervals in the perimeter which are not along the natural base. The algorithm divides the initial region into two logical triangles, and subsequently divides each of the two triangles into three subregions. This results in a total of six rectangular subregions. This always produces two interior nodes attached to only 3 elements in the mesh. Again the location of these two nodes can be controlled with boundary interval assignment. The length weighted Laplacian smoother 6S or the centroid pull smoother 4S may be helpful in improving the element quality after initial generation.

Semicircle Primitive—C. A C in the scheme indicates that the region will be meshed as a semicircular region. This primitive has been designed for use with regions with two natural corners. It uses the same strategy as the transition region except that only two natural corners are chosen instead of four. The formation of two triangles again requires that there be at least 8 intervals around the perimeter of the region. No relationship is imposed between intervals of opposing sides of the region. However, for this scheme to produce a good initial mesh, there must be at least 4 intervals on each of the natural sides. As in the transition region, this algorithm always produces two interior nodes attached to only 3 elements on the mesh and the location of these two nodes can be controlled with boundary interval assignments. The length weighted Laplacian smoother 6S or the centroid area pull smoother 4S may be helpful in improving the element quality after initial generation.

Pentagon Primitive—U. A U in the scheme indicates that the region will be meshed as a pentagon primitive. This primitive has been designed for regions containing 5 natural sides and thus 5 natural corners. This primitive is useful for meshing around holes in square geometries and a number of other shapes. The algorithm subdivides the initial region into five subregions, and then combines these regions into the completed initial mesh. This requires that there be at least 10 intervals around the perimeter of the region to produce a mesh. Two other requirements must be met for this scheme to produce a good initial mesh. First, each of the natural sides must have at least 2 intervals. Second, the sum of the intervals on any two consecutive sides must be less that the sum of the intervals on the remaining three sides. This algorithm always produces one interior node which is attached to five elements rather than the standard four elements. The location of this node can be controlled by interval assignment. As interval assignments for all five sides become equal, the node connected to five elements becomes equally far from each boundary. Again, the length weighted Laplacian smoother 6S may be useful in improving the element quality after initial mesh generation.

Forced Rectangle Primitive. The lack of any other initial meshing scheme characters (B, C, M, U, or T) indicates that the region will be meshed as a forced rectangle. This is the most restraining of the initial meshing primitives (M is much more general). The forced rectangle requires that the first geometric side be explicitly defined by the user, and that this geometric side correspond to the logical side for mapping. This forces the choice of all corners, the first two from the side defined, and the last two based on the requirement that intervals on sides 1 and 2 are respectively equal to intervals on opposing sides 3 and 4. If no initial side is specified, the first line in the region list of lines is taken as forming the first logical side.

The initial mesh generated for a region can sometimes be improved by subsequent processing. The results of this processing is region dependent. The geometry of the region and the connectivity of the initial mesh generated for that region often are predominant factors in the success of the modification attempts. Generally a poorly generated mesh, (e.g. sides of an element fall along the same natural side, nodes initially placed outside the initial boundaries, etc.) is difficult to correct with subsequent processing. The exception to this is the circle primitive. Problems with element size variations and angle distortions, on the other hand, can often be resolved with further processing.

The modifications scheme options can be divide into three groups. The first group is the smoothing operations. The smoothers adjust interior node locations but do not change the initial element structure. The second group is the structural change operations. These operations change the connectivity and/or the number of elements in the region. The third group of options are parameter modifiers. These parameters adjust the effect of smoothing and structural change operations, and allow for repetitive sequences of operations.

FASTQ implements 6 different smoothing algorithms. Inclusion of the letter S in the scheme initiates smoothing using the algorithm currently in effect. Specifying numerals in the region scheme sets the corresponding smoother active for use when the next S in the scheme is reached. If an S is encountered in the scheme and no changes have occurred in the mesh of in the choice of active smoother since the last smoothing operation, the S is ignored. The smoother process is iterative, and the user can control the number of allowed iterations through changing parameters. The default smoother for rectangle primitive initial meshes before any structure adjustment operations is the Equipotential smoother 1. The default for all other meshes is the Area Pull and Laplacian smoother 2. The smoothers available are as follows:

1. Equipotential
2. Area Pull and Laplacian
3. Centroid Inverse Area Push and Laplacian
4. Centroid Area Pull
5. Laplacian
6. Length Weighted Laplacian.

Equipotential Smoother—1. A 1 in the scheme sets the active smoother to be the equipotential smoother if the mesh is regular in that the initial meshing primitive was rectangular and no structural adjustment operations have occurred. Otherwise the Area Pull and Laplacian smoother is used. This smoother attempts to move nodes to position a set of regular vertical lines and horizontal lines as two intersecting sets of equipotentials. It converges quickly, is effective on concave and convex regions, and can sometimes pull nodes which have fallen outside the region back into the interior.

Area Pull and Laplacian Smoother—2. A 2 in the scheme sets the active smoother to be the area pull and Laplacian smoother. It is the default smoother for nonregular meshes. This smoother moves nodes to let small elements grow at the expense of larger ones. It tends to pull nodes back into the interior of the region although not as well as the Equipotential smoother.

Centroid Inverse Area Push and Laplacian—3. A 3 in the scheme sets the active smoother to be the Centroid Inverse Area Push and Laplacian smoother. This smoother pushes small elements out to equalize adjacent element areas. It requires that no nodes be initially outside the boundary, and is fairly slow to converge. It does have a strong tendency to produce nearly square or rectangular elements.

Centroid Area Pull Smoother—4. A 4 in the scheme sets the active smoother to be the centroid area pull smoother.

This smoother attempts to force equal areas by pulling a node based on the direction of the centroid of all connected elements weighted by their respective areas. It works as well as the Laplacian smoother and has a tendency to pull nodes which fall outside the region back into the interior.

Laplacian Smoother*13* 5. A 5 in the scheme sets the active smoother to be the Laplacian smoother. This smoother is the most common algorithm used in other codes, and repositions nodes based on the average of the locations of all the nearest neighbors. It performs well if the region being smoothed is nicely convex. Otherwise, it often pushes nodes outside the boundary.

Length Weighted Laplacian—6. A 6 in the scheme sets the active smoother to be the Length Weighted Laplacian. This smoother moves a node along a vector sum of weighted vectors from the node to nearest neighbor nodes. The weighting is based on the relative distance to neighbor nodes. It tends to move nodes so that attached elements sides are of more equal.

The second group of mesh improvement options is the structural change operations. These operations change the connectivity and number of elements within the region. There are three structural change operations:

R Restructures connectivity within adjacent elements.

D Deletes all elements with angles smaller than a threshold.

W Deletes the element with the worst interior angle under a threshold.

N Adds an additional row of elements around the boundary.

Restructure—R. An R in the scheme causes FASTQ to search the mesh for adjacent elements where removing the shared line and replacing it with another results in two better elements. The quality of the elements is judged on a condition number which is sensitive to nonrectangular elements (nonsquare corners). This is an iterative and relatively expensive process since it requires that each adjacent pair of elements have the respective merit of all three possible connections evaluated. If a better choice can be made based on this evaluation, the connectivity of the two elements is adjusted to implement the change. Restructuring does not change the number of elements or nodes in a region.

Delete—D. A D in the scheme causes the deletion of all elements whose smallest interior angle is less than a threshold amount. The deletion is accomplished by collapsing the two nodes on the shortest diagonal into one. The value of the threshold can be adjusted with the V parameter. Since boundary nodes must remain in place to assure connectivity to adjacent regions, only those elements which will not effect the boundary nodes may be deleted.

Worst Element Deletion—W. A W allows the deletion of only one element. If any elements contain interior angles less than the threshold amount, the element with the smallest interior angle is deleted.

Necklacing—N. An N causes a shrinking of the original elements, and the generation of an extra row of elements around the boundary of the region. This should usually be followed by a smoothing operation. Multiple necklaces may be installed on a region.

Several parameters controlling the effect of smoothers and structural change operations can be changed by the user. These parameters include:

A or+A Increase smoothing parameter by 0.1 to force more equal element areas. The default is 0.7. The maximum is 1.0.

−A Decrease smoothing parameter by 0.1

F or F+Increases smoothing relaxation parameter by 0.25. The default is 1.0. This increases node movement per iteration.

−F Decrease the smoothing relaxation parameter by 0.25.

I or+I Increases the maximum allowable number of iterations for smoothing by 50%. The default is 5 times the number of elements.

−I Decrease the maximum allowable iterations for smoothing by 33%.

J or+J Increases the node movement tolerance for convergence of smoothing by a factor of the cube root of 2. The default is 3% of the smallest element side length.

−J Decreases the node movement tolerance for convergence of smoothing by a factor of the cube root of 2.

A sequence of operations can be repeated with the use of the left ( and right) parenthesis. This causes the scheme sequence contained within the parenthesis to be repeated until the repetition causes no change in the mesh. For poor initial meshes, a loop of (DRS) is sometimes useful. Nested loops are also supported.

PREDICTION

Those skilled in the art will appreciate various techniques for predicting behavior of materials in a mesh-represented problem space, including examples. The present invention is not limited to a specific prediction technique. One suitable prediction method is described in ALEGRA, a coupled physics code described by Summers et al. in "ALEGRA: An advanced framework for high energy density solid dynamics simulations," SAND97-2636C, incorporated herein by reference.

In 1990, an effort was launched at Sandia National Laboratories to develop a state-of-the-art code that combined the modeling features of modern Eulerian shock codes, such as CTH, with the improved numerical accuracy of modem Lagrangian structural analysis codes. This code, now called ALEGRA, uses an arbitrary Lagrangian-Eulerian (ALE) formulation on an unstructured mesh. This formulation allows the user to designate whether material should flow through a stationary mesh (pure Eulerian), whether the mesh should move with the material (pure Lagrangian), or whether the mesh should move independently from the material motion (arbitrary). This latter capability permits a calculation to proceed in Lagrangian fashion until the mesh becomes too highly distorted. At that time, mesh points in the most deformed portion of the mesh are moved to reduce the distortion to acceptable levels. The advantage is that numerical dissipation is avoided until large deformations occur and then is limited to only those regions where there are severe mesh distortions and the mesh must be moved. ALEGRA is written predominantly in the C++ programming language, though we have limited our use of some features of C++ to avoid efficiency problems. This allows us to take advantage of object-oriented programming techniques in managing the inherent complexity of the physics being modeled. However, we have also recognized the utility of incorporating various Fortran-based models and libraries if they best serve our modeling needs and if they are sufficiently mature and robust. In many cases there is little advantage to rewriting such software.

ALEGRA has been designed to run on distributed-memory parallel computers. This was done because we needed the enormous memories and processor speed of massively parallel processor (MPP) computers to analyze large, three-dimensional problems. The memory requirements for our codes scale inversely with the cube of the zone size. For example, if we halve the mesh size in each direction, then the memory requirement increases by a factor of eight. These codes use explicit time integration schemes so the time step scales inversely with the mesh size. For example, if we halve the mesh size, then the code cuts the time step in half. Therefore, the Floating Point Operations (FLOPS) scale as the fourth power of the mesh size. Since the FLOP requirements increase faster than the memory requirements, simply increasing the memory on existing supercomputers is not a good solution to running larger problems because the run time quickly becomes excessive. The database of a large, three-dimensional problem is too large to fit on any single compute node. Therefore, ALEGRA was designed with the Single Program Multiple Data (SPMD) paradigm, in which the mesh is decomposed into sub-meshes so that each processor gets a single sub-mesh with approximately the same number of elements. Good mesh decomposition is important to minimize the memory requirements, balance the work on the compute nodes and minimize the data passed between compute nodes. Whereas rectangular meshes are relatively easy to decompose, subdividing the arbitrary connectivity meshes used by ALEGRA is much more difficult. We use Sandia's Chaco package to decompose these meshes.

ALEGRA uses one layer of ghost elements around the sub-mesh perimeter for subdomain boundary conditions. The database for the ghost elements must be updated once each computational cycle by interprocessor communication. These additional ghost elements represent a parallel processing cost that can be quite large for compute nodes with a small number of elements. For example, for a 1,000-element mesh, approximately half the elements are boundary elements. For large, roughly cubic meshes, the fraction of boundary elements goes to approximately $6/N^{1/3}$, where N is the number of elements, so a million-element mesh will include only about 6% boundary elements. Therefore, we use sub-meshes that fill each compute node's memory to minimize the number of ghost elements. Minimizing the number of boundary elements also minimizes the amount of data passed between compute nodes.

Recent efforts have focused on the development of specialized numerical algorithms and physics models in support of DOE's Accelerated Strategic Computing Initiative (ASCI), Defense Programs (DP), and Inertial Confinement Fusion (ICF) program. The version of ALEGRA that utilizes h-adaptivity (referring to the subdivision of the characteristic element length, h) is called HAMMER. The objective of HAMMER is to provide efficient, high precision simulations without the computational cost of using a highly resolved mesh everywhere. This capability is critical for simulations over large spatial domains that require high precision in the presence of certain features such as shocks, bum fronts, pressure stagnation areas, and regions of large deformation. The version of ALEGRA that incorporates new electromechanical modeling capabilities for simulating fireset and neutron generator power supply performance is called EMMA (Electromechanical Modeling in ALEGRA). EMMA capabilities include the modeling of shock propagation due to explosive detonation, depoling of ferroelectric ceramics, application of a parallel field solver to determine the electric field, and coupling with an external lumped element circuit equation system. The version of ALEGRA that incorporates magnetohydrodynamic modeling is called HYRUM. Magnetohydrodynamics involves the interaction of electric and magnetic fields coupled with the transport of mass, momentum and energy. HYRUM is intended for applications where finite electrical conductivity materials are involved and the diffusion of the magnetic field and current occurs on time scales that correspond to the hydrodynamic phenomena. An example of this type of interaction involves the "z-pinch behavior of a cylindrical conductor subjected to a current. For this class of problems, HYRUM relies upon the quasi-static magnetic field approximation to Maxwell's equations and uses the advanced ALE algorithms found in ALEGRA. The HELIOS parallel code coupling effort is focusing upon providing new computational capabilities utilizing high-performance, massively parallel supercomputers and scalable, parallel software for problems where significantly different length and time scales are present. ALEGRA and GILA, an Eulerian, unstructured grid, massively parallel flow code with both explicit and semi-implicit flow solution algorithms, have been selected for the initial implementation and technology demonstration.

The prediction method in ALEGRA includes the following steps.

1. Initialize parameters, including energy increment, external energy, time step, nodal forces, nodal moments, nodal masses, external forces.
2. Determine forces and moments due to stress divergence.
3. Determine forces and moments for hourglass control.
4. Determine artificial forces resulting from artificial viscosity.
5. Update nodal masses.
6. Determine external forces.
7. Determine nodal accelerations and nodal angular accelerations.
8. Predict velocity at the midpoint of the next time step.
9. Enforce kinematic boundary conditions and rotational kinematic boundary conditions.
10. Predict coordinates at the end of the time step.
11. Apply contact constraints.
12. Determine velocity at the beginning and midpoint of the time step.
13. Determine rotational velocity at the midpoint of the time step.
14. Determine final coordinates and store if needed for later analysis.
15. Determine deformation rates and update material states.
16. Update artificial viscosity and hourglass stiffness.

MAPPING

Establishing and maintaining correspondence between Lagrangian and ALE boundary nodes is important to the operation of the present invention. Details of the implementation of this step can depend on details of the meshing and prediction techniques employed. Initial node correspondence can be established as part of the meshing of the problem space. After each prediction step, correspondence can be reestablished. For example, the locations of Lagrangian boundary nodes can be determined. Boundary ALE nodes can be adjusted, for example by changing a boundary of the node, to reestablish the correspondence. For example, this can be accomplished by the following steps.

1. Move Lagrangian mesh nodes to follow material.
2. Identify Lagrangian boundary nodes.
3. Identify ALE boundary nodes that correspond to Lagrangian boundary nodes.
4. Adjust the coordinates of the ALE boundary nodes so that correspondence with Lagrangian boundary nodes is maintained.

SMOOTHING

Mapping after mesh node movement to maintain node correspondence can lead to distorted mesh nodes. For example, mapping ALE mesh nodes to retain correspondence with Lagrangian mesh nodes undergoing significant motion can lead to elongated, overly large or small, or twisted ALE mesh nodes. Distortion of mesh nodes can degrade the performance or efficiency of the prediction. Smoothing the mesh can reduce the distortion. Various smoothing techniques known to those skilled in the art can be appropriate for use in the present invention. Examples of suitable smoothing techniques include those described by Benson in "An Efficient, Accurate, Simple ALE Method for Nonlinear Finite Element Programs," in Computer Methods in Applied Mechanics and Engineering 72 (1989), incorporated herein by reference, and by Benson in "Vectorization Techniques for Explicit Arbitrary Lagrangian-Eulerian Calculations," Computer Methods in Applied Mechanics and Engineering, incorporated herein by reference.

APPARATUS FOR MODELING INTERACTIONS

Figure 4:
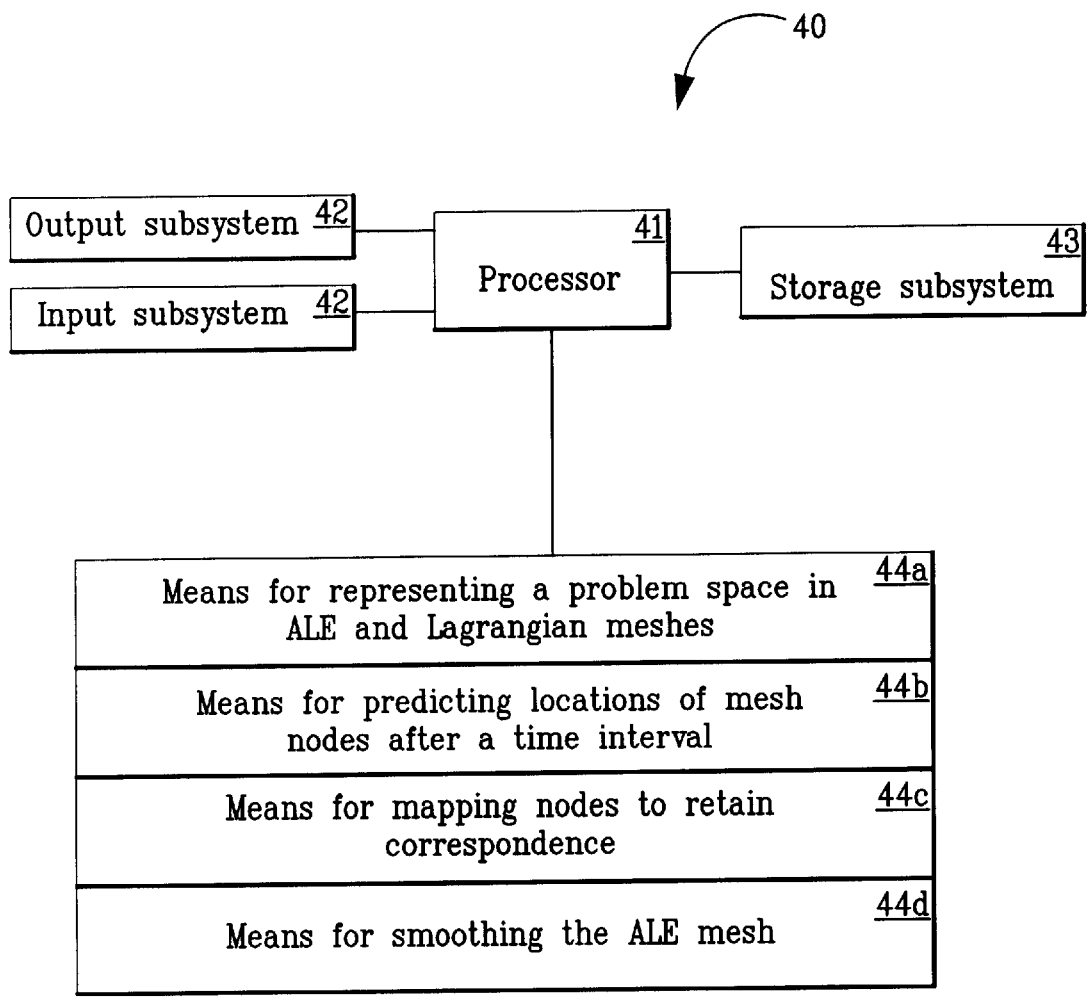
FIG. 4 is a schematic view of an apparatus according to the present invention.

FIG. 4 shows an apparatus 40 according to the present invention. A processor 41 connects with an input/output subsystem 42 and storage 43. Apparatus 40 also comprises means for representing, in storage 43, representations of portions of the problem space in ALE and Lagrangian meshes 44a, means for predicting the locations of the mesh nodes after a time interval 44b, means for mapping the nodes after prediction 44c, and means for smoothing the ALE mesh 44d. For example, processor 40 can comprise a workstation such as contemporary workstations from Sun, IBM, HPUX, and Silicon Graphics, with local storage such as disk and semiconductor memory, input/output such as a keyboard, display, and network connection. The means for representing, in storage 43, representations of portions of the problem space in ALE and Lagrangian meshes 44a, means for predicting the locations of the mesh nodes after a time interval 44b, means for mapping the nodes after prediction 44c, and means for smoothing the ALE mesh 44d can comprise computer software, hardware, network downloads, or combinations thereof. Apparatus 40 can also comprise a multiprocessor computer such as the Intel Paragon.

EXAMPLE IMPLEMENTATION

As an example, the present invention was implemented as a module within ALEGRA. ALEGRA is written mostly in the C++ programming language, and is supported on Sub, HPUX, IBM, and Silicon Graphics workstations and on the Teraflops supercomputer. All of those platforms use the UNIX operating system, and ALEGRA assumes a UNIX operating environment.

RESULTS ACHIEVED WITH THE EXAMPLE IMPLEMENTATION

Figure 5A:
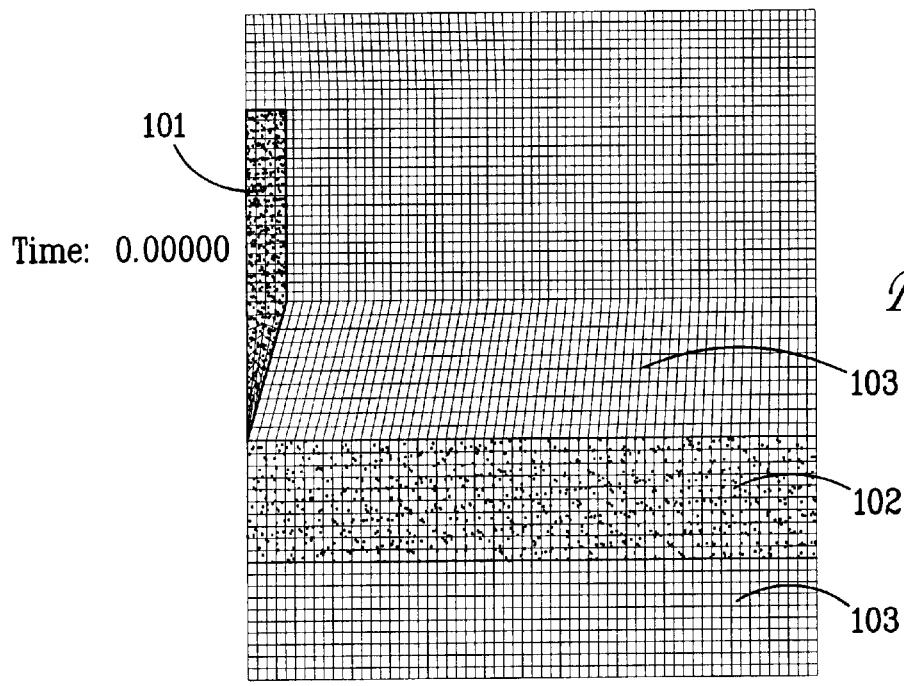
FIGS. 5 (a,b,c,d) are illustrations of sample results achieved with an example implementation of the present invention.
Figure 5B:
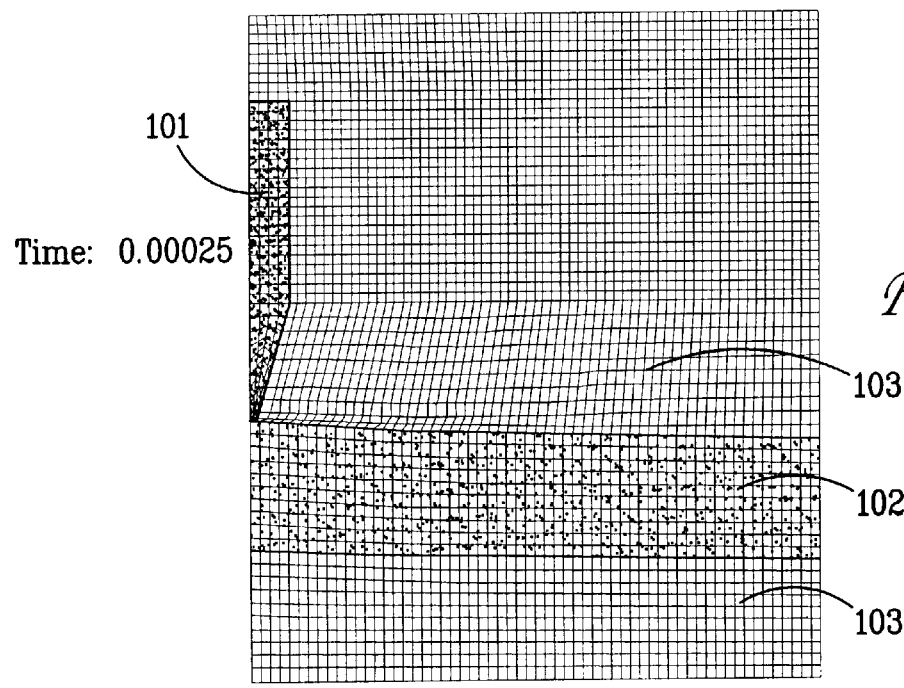
Figure 5C:
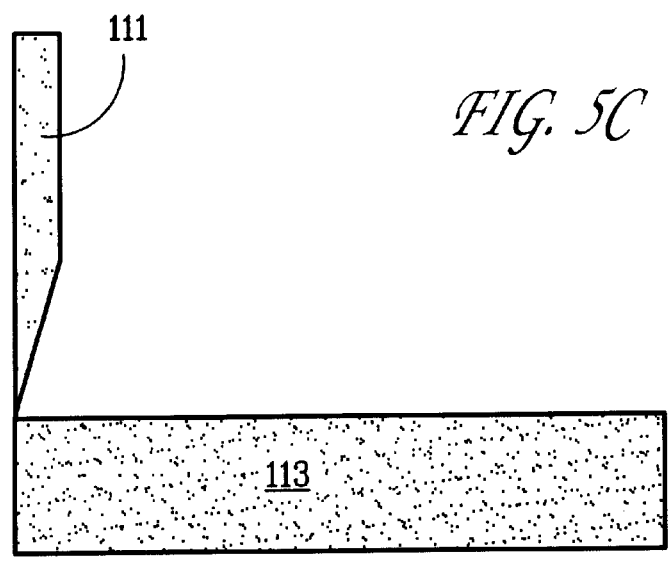
Figure 5D:
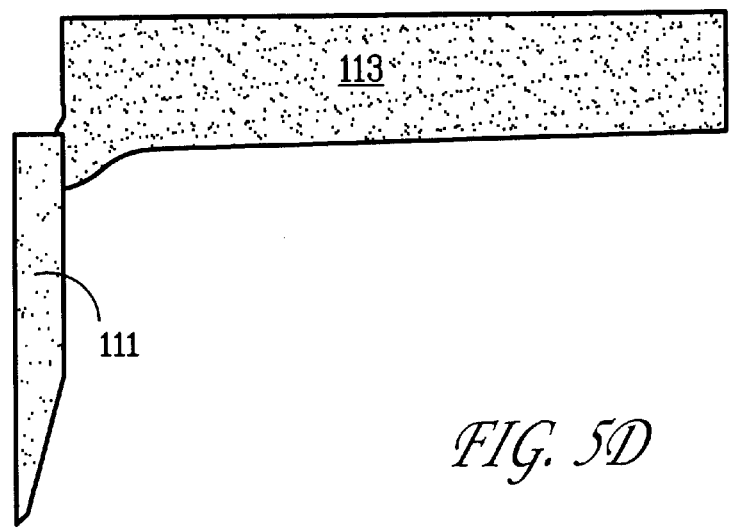
Figure 5D:
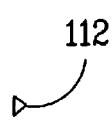

The example implementation was used to model interactions such as a tungsten penetrator penetrating an aluminum sheet. The interaction was modeled as a reverse ballistic interaction, so the penetrator was initially at rest and the plate was to strike it at an initial velocity of 27.8 m/s. Results obtained from the example implementation modeling this interaction are shown in FIGS. 5(a,b,c,d). FIG. 5a shows the mesh at the beginning of the prediction. The tungsten penetrator was represented with a Lagrangian mesh 101. The aluminum sheet was represented with an ALE mesh 102. The rest of the problem space was represented in an ALE mesh 103. FIG. 5b shows the mesh after prediction of the interaction. The Lagrangian mesh representing the penetrator has been blunted, reflecting the end of the penetrator being blunted by interaction with the plate. The ALE mesh nodes have been kept in correspondence with the Lagrangian mesh nodes, and smoothing has prevented any significant distortion of the ALE mesh nodes. FIG. 5c shows the material surfaces before prediction; FIG. 5d shows them after prediction. The penetrator 111 has passed beyond the initial boundary of the plate. Some material 112 from the plate 113 has spalled off, and the plate 113 has deformed in response to the interaction with the penetrator 111. The penetrator 111 end has been blunted by interaction with the plate 113.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

I claim:

1. A method of modeling, within a problem space, an interaction between a first body and a second body, wherein said first body is substantially more resistant to deformation than the material in said second body, comprising:
   a) representing said first body with a first portion of said problem space using a Lagrangian mesh;
   b) representing said second body with a second portion of said problem space using an ALE mesh, wherein each node in said Lagrangian mesh that is on a boundary between said Lagrangian mesh and said ALE mesh is in correspondence with an adjacent node in said ALE mesh;
   c) predicting the locations of the Lagrangian and ALE mesh nodes after a time interval;
   d) mapping the nodes in said ALE mesh so that each node on the surface of said Lagrangian mesh is aligned with its corresponding node in said ALE mesh; and
   e) repeating steps c) and d) until a terminal condition is reached.

2. The method of claim 1, wherein each node on the surface of said Lagrangian mesh is in one-to-one correspondence with an adjacent node in said ALE mesh.

3. The method of claim 1, further comprising smoothing said ALE mesh.

4. The method of claim 1, further comprising smoothing said ALE mesh after each mapping step.

5. The method of claim 1, wherein said step of predicting the locations comprises:
   a) predicting locations based on initial node velocities and initial node locations, stress states, body forces, and boundary stresses;
   b) enforcing contacts between surfaces in said problem space;
   c) adjusting said ALE mesh and said Lagrangian mesh so that there is substantially no overlap therebetween.

6. The method of claim 3, wherein said step of smoothing said ALE mesh comprises:
   a) selecting nodes in the ALE mesh that meet a smoothing criteria;
   b) determining new locations for each of the selected nodes from the current location of said node and from a smoothing template.

7. The method of claim 3, wherein said step of smoothing said ALE mesh comprises adjusting the positions of nodes in said ALE mesh based on motion of nodes in said Lagrangian mesh.

8. The method of claim 3, wherein said step of smoothing said ALE mesh comprises adjusting the positions of nodes in said ALE mesh based on motion of nodes in said Lagrangian mesh so that centers of mass remain in substantially the same relative relationship.

9. A method of using a computer to model, within a problem space, an interaction between a first body and a second body, wherein said first body is substantially more resistant to deformation than the material in said second body, comprising:
   a) inputting into said computer a representation of said first body with a first portion of said problem space using a Lagrangian mesh;
   b) inputting into said computer a representation of said second body with a second portion of said problem space using an ALE mesh, wherein each node in said Lagrangian mesh that is on a boundary between said Lagrangian mesh and said ALE mesh is in correspondence with an adjacent node in said ALE mesh;
   c) using said computer to predict the locations of the Lagrangian and ALE mesh nodes after a time interval;
   d) using said computer to map the nodes in said ALE mesh so that each node on the surface of said Lagrangian mesh is aligned with its corresponding node in said ALE mesh; and
   e) repeating steps c) and d) until a terminal condition is reached.

10. The method of claim 9, wherein each node on the surface of said Lagrangian mesh is in one-to-one correspondence with an adjacent node in said ALE mesh.

11. The method of claim 9, further comprising using the computer to smooth said ALE mesh.

12. The method of claim 9, further comprising using the computer to smooth said ALE mesh after each use of the computer to map the nodes in said ALE mesh.

13. The method of claim 9, wherein said step of using said computer to predict the locations comprises:
   a) using said computer to predict locations based on initial node velocities and initial node locations, stress states, body forces, and boundary stresses;
   b) using the computer to enforce contacts between surfaces in the problem space;
   c) using the computer to adjust said ALE mesh and said Lagrangian mesh so that there is substantially no overlap therebetween.

14. The method of claim 11, wherein said step of using the computer to smooth said ALE mesh comprises:
   a) selecting nodes in the ALE mesh that meet a smoothing criteria;
   b) determining new locations for each of the selected nodes from the current location of said node and from a smoothing template.

15. The method of claim 11, wherein said step of using said computer to smooth said ALE mesh comprises adjusting the positions of nodes in said ALE mesh based on motion of nodes in said Lagrangian mesh.

16. The method of claim 11, wherein said step of using said computer to smooth said ALE mesh comprises adjusting the positions of nodes in said ALE mesh based on motion of nodes in said Lagrangian mesh so that centers of mass remain in substantially the same relative relationship.

17. An apparatus for modeling, within a problem space, an interaction between a first body and a second body, wherein said first body is substantially more resistant to deformation than the material in said second body, comprising:
   a) a processor;
   b) storage accessible from said processor;
   c) an input subsystem accessible from said processor;
   d) an output subsystem accessible from said processor;
   e) means for using said input subsystem and said processor to represent in said storage said first body with a first portion of said problem space using a Lagrangian mesh;
   f) means for representing in said storage said second body with a second portion of said problem space using an ALE mesh, wherein each node in said Lagrangian mesh that is on a boundary between said Lagrangian mesh and said ALE mesh is in correspondence with an adjacent node in said ALE mesh;
   g) means for predicting the locations of the Lagrangian and ALE mesh nodes after a time interval;
   h) means for mapping the nodes in said ALE mesh so that each node on the surface of said Lagrangian mesh is aligned with its corresponding node in said ALE mesh;
   i) means for repeating steps g) and h) until a terminal condition is reached; and
   j) means for using said processor and said output subsystem to communicate predicted locations.

18. The apparatus of claim 17, wherein each node on the surface of said Lagrangian mesh is in one-to-one correspondence with an adjacent node in said ALE mesh.

19. The apparatus of claim 17, further comprising means for smoothing said ALE mesh.

20. The apparatus of claim 17, further comprising means for smoothing said ALE mesh after each mapping of the nodes in sa ALE,mesh.

21. The apparatus of claim 17, wherein said means for predicting the locations comprises:
   a) means for predicting locations based on initial node velocities and initial node locations, stress states, body forces, and boundary stresses;
   b) means for enforcing contacts between surfaces in said problem space;
   c) means for adjusting said ALE mesh and said Lagrangian mesh so that there is substantially no overlap therebetween.

22. The apparatus of claim 19, wherein said means for smoothing said ALE mesh comprises:
   a) means for selecting nodes in the ALE mesh that meet a smoothing criteria;
   b) means for determining new locations for each of the selected nodes from the current location of said node and from a smoothing template.

23. The apparatus of claim 19, wherein said means for smoothing said ALE mesh comprises means for adjusting the positions of nodes in said ALE mesh based on motion of nodes in said Lagrangian mesh.

24. The apparatus of claim 19, wherein said means for smoothing said ALE mesh comprises means for adjusting the positions of nodes in said ALE mesh based on motion of nodes in said Lagrangian mesh so that centers of mass remain in substantially the same relative relationship.

* * * * *